(12) United States Patent
Zhang et al.

(10) Patent No.: US 12,170,294 B2
(45) Date of Patent: Dec. 17, 2024

(54) ARRAY SUBSTRATE, PREPARATION METHOD THEREOF, AND DISPLAY APPARATUS

(71) Applicants: Chuzhou HKC Optoelectronics Technology Co., Ltd., Chuzhou (CN); HKC CORPORATION LIMITED, Shenzhen (CN)

(72) Inventors: Lizhi Zhang, Shenzhen (CN); Baohong Kang, Shenzhen (CN)

(73) Assignees: Chuzhou HKC Optoelectronics Technology Co., Ltd., Chuzhou (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/219,679

(22) Filed: Jul. 9, 2023

(65) Prior Publication Data
US 2024/0313008 A1     Sep. 19, 2024

(30) Foreign Application Priority Data
Mar. 14, 2023 (CN) .......................... 202310259759.0

(51) Int. Cl.
*G02F 1/1362* (2006.01)
*G02F 1/1368* (2006.01)
(Continued)

(52) U.S. Cl.
CPC .... *H01L 27/1255* (2013.01); *G02F 1/136213* (2013.01); *G02F 1/136286* (2013.01);
(Continued)

(58) Field of Classification Search
CPC . H01L 27/1255; H01L 27/127; H01L 27/124; G02F 1/136213; G02F 1/136286; G02F 1/1368; G02F 1/167
See application file for complete search history.

(56) References Cited

U.S. PATENT DOCUMENTS

2022/0229338 A1\* 7/2022 Zhu .................. G02F 1/136286

FOREIGN PATENT DOCUMENTS

| CN | 101359693 A | 2/2009 |
|---|---|---|
| CN | 103135301 A | 6/2013 |

(Continued)

OTHER PUBLICATIONS

CN 111965908 A (Su, Qiu-jie et al.) translation (Year: 2020).\*
(Continued)

*Primary Examiner* — James A Dudek

(57) ABSTRACT

An array substrate, a preparation method thereof and a display apparatus are provided. The array substrate includes a plurality of pixel units distributed in a matrix and a plurality of scan lines and a plurality of data lines. Each pixel unit includes a display region and a device region. The display region includes a pixel electrode and a common electrode. The pixel electrode at least partially overlaps with the common electrode to form a first storage capacitor. The device region includes a drive transistor. The gate extends in a direction towards the display region to form a first extension portion; the drain extends in the direction towards the display region to form a second extension portion. The second extension portion is electrically connected to the pixel electrode. The first extension portion and the second extension portion overlap to form a second storage capacitor.

17 Claims, 7 Drawing Sheets

(51) Int. Cl.
*G02F 1/167* (2019.01)
*H01L 27/12* (2006.01)

(52) U.S. Cl.
CPC ............ *G02F 1/1368* (2013.01); *G02F 1/167* (2013.01); *H01L 27/127* (2013.01); *H01L 27/124* (2013.01)

(56) References Cited

FOREIGN PATENT DOCUMENTS

| CN | 103268046 A | 8/2013 |
| CN | 103295959 A | 9/2013 |
| CN | 105487315 A | 4/2016 |
| CN | 105182647 B | 1/2019 |
| CN | 111965908 A | 11/2020 |
| CN | 113625485 A | 11/2021 |
| CN | 217060715 U | 7/2022 |

OTHER PUBLICATIONS

International Search Report, International Application No. PCT/CN2023/103348, mailed Oct. 2, 2023 (14 pages).
Chinese First Office Action, Chinese Application No. 202310259759.0, mailed Apr. 14, 2024 (16 pages).
Chinese Notification to Grant Patent Right for Invention, Chinese Application No. 202310259759.0, mailed Jun. 24, 2024 (5 pages).

* cited by examiner

ARRAY SUBSTRATE, PREPARATION METHOD THEREOF, AND DISPLAY APPARATUS

CROSS REFERENCE TO RELATED APPLICATIONS

The present application is based on the Chinese Patent Application No. 202310259759.0 filed on Mar. 14, 2023 and claims priority thereof. The entire contents of the Chinese application are hereby incorporated by reference in their entireties.

TECHNICAL FIELD

The present application relates to the field of display technologies, and in particular to an array substrate, a preparation method thereof and a display apparatus.

BACKGROUND

With development of the display technologies and breakthroughs in dynamic picture production technologies in the fields of gaming and animation, demands for display panels supporting the variable refresh rate technology are becoming more and more remarkable in order to synchronize and match with the frame rates of dynamic pictures and to reduce picture tearing phenomenon.

Nowadays, for a display panel supporting variable refresh rate, due to a 4-Mask process, during a process when a scan line is turned on or off, a parasitic capacitance between a gate and a source of a drive transistor would change, and a feed-in voltage of a pixel would change accordingly, resulting in a screen flicker. In the related art, the problem is usually solved by adding a photomask manufacturing procedure, which changes the 4-Mask process to a 5-Mask process, in order to solve the problem.

However, by adding the photomask manufacturing procedure to alleviate the problem of screen flicker caused by pixel feed-in voltage difference, production cost is increased and production efficiency is reduced.

SUMMARY OF THE DISCLOSURE

The present application provides an array substrate, a preparation method thereof and a display apparatus, aiming to solve the problem in the related art that: by adding the photomask manufacturing procedure to alleviate the problem of screen flicker caused by the pixel feed-in voltage difference, the production cost is increased and the production efficiency is reduced.

To solve the above-mentioned technical problem, a first technical scheme adopted by the present application is to provide an array substrate. The array substrate includes a plurality of pixel units distributed in a matrix and a plurality of scan lines and a plurality of data lines. The plurality of scan lines and the plurality of data lines are configured for driving the plurality of pixel units. Each of the pixel units includes a display region and a device region. The display region includes a pixel electrode and a common electrode. The pixel electrode at least partially overlaps with the common electrode in a direction perpendicular to the array substrate to form a first storage capacitor. The device region is adjacent to the display region and includes a drive transistor. The drive transistor is electrically connected to the pixel electrode. The drive transistor includes a gate, an active layer, a source and a drain. The gate is electrically connected to a corresponding one of the plurality of scan lines. The source is electrically connected to a corresponding one of the plurality of data lines. The drain is electrically connected to the pixel electrode. The gate extends in a direction towards the display region to form a first extension portion. The drain extends in the direction towards the display region to form a second extension portion. The second extension portion is electrically connected to the pixel electrode. The first extension portion and the second extension portion overlap in the direction perpendicular to the array substrate to form a second storage capacitor.

In some embodiments, the pixel electrode partially extends to the device region to form a third extension portion. The third extension portion is electrically connected to the second extension portion through a conductive via. The third extension portion overlaps with the first extension portion in the direction perpendicular to the array substrate, to form a third storage capacitor.

In some embodiments, the array substrate includes an underlayer substrate. The array substrate further includes a first metal layer, a first insulating layer, an active layer, a second metal layer, a second insulating layer and a transparent conductive layer successively laminated on the underlayer substrate. The scan line, the gate and the common electrode are located in the first metal layer. The data line, the source and the drain are located in the second metal layer. The pixel electrode is located in the transparent conductive layer.

In some embodiments, the active layer is provided between the gate and the source and between the gate and the drain, and a projection of the gate onto the second metal layer completely covers that of the active layer onto the second metal layer.

In some embodiments, the pixel electrode includes a main electrode and a branch electrode. The main electrode divides the display region into a plurality of domains. The branch electrode is electrically connected to the main electrode. The common electrode includes a first portion and a second portion. The first portion extends along an edge of a whole profile of the pixel electrode to form an annulus. The second portion overlaps with the main electrode in a direction perpendicular to the array substrate. The opposite two ends of the second portion are electrically connected to the first portion.

To solve the above-mentioned technical problem, a second technical scheme adopted by the present application is to provide a preparation method of an array substrate. The preparation method includes: providing an underlayer substrate, and dividing the underlayer substrate into a plurality of pixel unit regions distributed in a matrix, wherein, each of the plurality of pixel unit regions includes a display region and a device region; depositing a first metal layer on one side of the underlayer substrate, to form a scan line between every two adjacent rows of the pixel unit regions, to form a common electrode in the display region, to form a gate in the device region, and to electrically connect the gate to a corresponding scan line, wherein, the gate extends in a direction towards the display region to form a first extension portion; fabricating a first insulating layer on one side of the first metal layer away from the underlayer substrate; fabricating an active layer on one side of the first insulating layer away from the underlayer substrate, and arranging the active layer above the gate; depositing a second metal layer on one side of the active layer away from the underlayer substrate, to form a data line between every two adjacent columns of the pixel unit regions, to form a source and a drain in the device region, and to electrically connect the source to a corresponding data line, wherein, the drain extends in the direction towards the display region to form a second extension portion, the second extension portion overlaps with the first extension portion in a direction perpendicular to the underlayer substrate, and forms a second storage capacitor; fabricating a second insulating layer on one side of the second metal layer away from the underlayer substrate; and fabricating a transparent conductive layer on a first side of the second insulating layer away from the underlayer substrate, to form a pixel electrode in the display region, and to form a first storage capacitor by the pixel electrode with one side of the common electrode away from the underlayer substrate.

In some embodiments, after the fabricating the second insulating layer on one side of the second metal layer away from the underlayer substrate, the method further includes: defining a conductive via in the second insulating layer located in an area of the second extension portion, and electrically connecting the conductive via to the second extension portion. The fabricating the transparent conductive layer on the first side of the second insulating layer away from the underlayer substrate further includes: extending the pixel electrode in a direction towards the device region to form a third extension portion, covering the conductive via with the third extension portion and electrically connecting the third extension portion with the second extension portion; and arranging the third extension portion above the first extension portion, such that the third extension portion and the first extension portion overlap in the direction perpendicular to the underlayer substrate to form a third storage capacitor.

In some embodiments, a projection of the gate onto the underlayer substrate completely covers a projection of the active layer onto the underlayer substrate.

In some embodiments, the depositing the first metal layer on one side of the underlayer substrate, to form the scan line between every two adjacent rows of the pixel unit regions, to form the common electrode in the display region, to form the gate in the device region, and to electrically connect the gate to the corresponding scan line further includes: depositing the first metal layer on one side of the underlayer substrate; and patterning the first metal layer to form the scan line between every two adjacent rows of pixel unit regions, to form the common electrode in the display region, to form the gate in the device region, and to electrically connect the gate to the corresponding scan line. The depositing the second metal layer on one side of the active layer away from the underlayer substrate, to form the data line between every two adjacent columns of the pixel unit regions, to form the source and the drain in the device region, and to electrically connect the source to the corresponding data line includes: depositing the second metal layer on the side of the active layer away from the underlayer substrate; and patterning the second metal layer, to form the data line between every two adjacent columns of the pixel unit regions, to form the source and the drain in the device region, and to electrically connect the source to the corresponding data line.

To solve the above-mentioned technical problem, a third technical solution adopted by the present application is to provide a display apparatus. The display apparatus includes: a display panel and a backlight module. The display panel is configured for displaying an image. The display panel includes an array substrate. The backlight module is arranged opposite to the display panel and configured for providing backlight for the display panel. The array substrate includes a plurality of pixel units distributed in a matrix and a plurality of scan lines and a plurality of data lines. The plurality of scan lines and the plurality of data lines are configured for driving the plurality of pixel units. Each of the pixel units includes a display region and a device region. The display region includes a pixel electrode and a common electrode. The pixel electrode at least partially overlaps with the common electrode in a direction perpendicular to the array substrate to form a first storage capacitor. The device region is adjacent to the display region and includes a drive transistor. The drive transistor is electrically connected to the pixel electrode. The drive transistor includes a gate, an active layer, a source and a drain. The gate is electrically connected to a corresponding one of the plurality of scan lines. The source is electrically connected to a corresponding one of the plurality of data lines. The drain is electrically connected to the pixel electrode. The gate extends in a direction towards the display region to form a first extension portion. The drain extends in the direction towards the display region to form a second extension portion. The second extension portion is electrically connected to the pixel electrode. The first extension portion and the second extension portion overlap in the direction perpendicular to the array substrate to form a second storage capacitor.

The advantage of the present application is: different from the related art, an array substrate and a preparation method, a display apparatus thereof are provided in the present application. The array substrate includes a plurality of pixel units distributed in a matrix and a plurality of scan lines and a plurality of data lines. The plurality of scan lines and the plurality of data lines are configured for driving the plurality of pixel units. In the present application, the gate of the drive transistor in the device region extends in the direction towards the display region to form the first extension portion, while the drain of the drive transistor extends in the direction towards the display region to form the second extension portion. The second extension portion is electrically connected to the pixel electrode. The first extension portion and the second extension portion overlap in the direction perpendicular to the array substrate to form the second storage capacitor. The two ends of the second storage capacitor are electrically connected to the gate and the pixel electrodes respectively, such that that electrical capacitance of the second storage capacitor varies with turning on and turning off of the gate, to compensate for a difference value by which the feed-in voltage difference becomes greater due to the variable gate source capacitance. In this way, the screen flicker phenomenon of the display panel is effectively mitigated and the quality of the finished product is improved. Meanwhile, in the present application, the structure of the second storage capacitor is formed by extending the gate to form the first extension portion and by extending the drain to form the second extension portion. Not only the structure is simple, but it also allows that, during the preparation process of the array substrate, only the shapes of the gate and the drain need to be modified, no additional manufacturing procedures and processes are necessary, the production cost and the production time consumption are effectively saved, and the production efficiency is improved.

BRIEF DESCRIPTION OF THE DRAWINGS

In order to more clearly illustrate technical solutions in the present application, drawings required in the description of the embodiments will be briefly introduced below. Obviously, the drawings in the following description are only some embodiments of the present application. For those of ordinary skills in the art, other drawings could be obtained based on these drawings without creative efforts.

REFERENCE NUMBER

Figure 1:
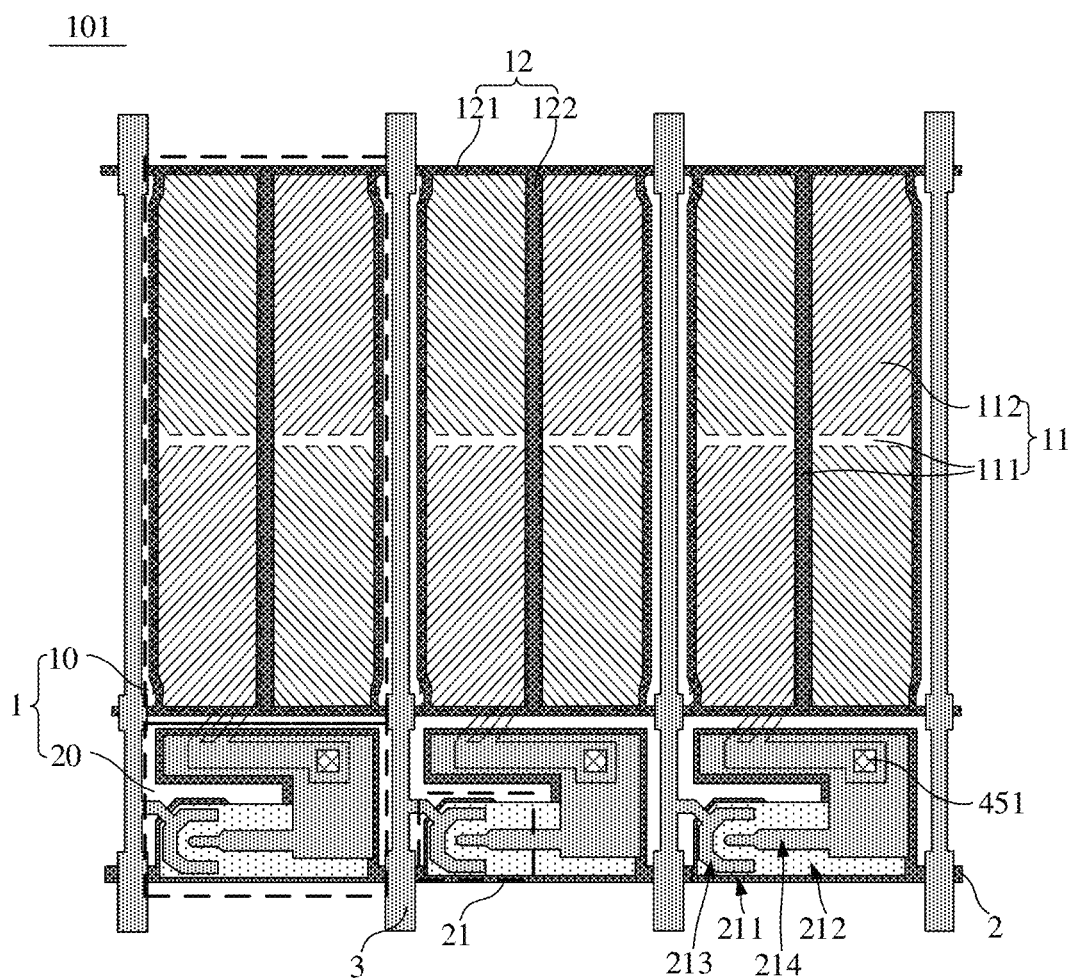
FIG. 1 is a schematic structural diagram of an array substrate according to a first embodiment of the present application.

100—display panel; 101—array substrate; 102—color film substrate; 103—liquid crystal layer; 200—backlight module; 1—pixel unit; 2—scan line; 3—data line; 10—display region; 11—pixel electrode; 111—main electrode; 112—branch electrode; 113—third extension portion; 12—common electrode; 121—first portion; 122—second portion; 20—device region; 21—drive transistor; 211—gate; 2111—first extension portion; 212—active layer; 213—source; 214—drain; 2141—second extension portion; 41—underlayer substrate; 411—pixel unit region; 4111—display region; 4112—device region; 42—first metal layer; 43—first insulating layer; 44—second metal layer; 45—second insulating layer; 451—conductive via; 46—transparent conductive layer.

DETAILED DESCRIPTION

The technical scheme of embodiments of the present application is described in detail below in conjunction with the accompanying drawings.

In the following description, specific details such as particular system structures, interfaces, techniques, etc. are presented for the purpose of illustration and not for the purpose of limitation, in order to facilitate a thorough understanding of the present application.

Technical schemes in embodiments of the present application will be described clearly and thoroughly in connection with accompanying drawing of the embodiments of the present application. Obviously, the described embodiments are only a part of the embodiments, but not all of them. All other embodiments by a person of ordinary skills in the art based on embodiments of the present application without creative efforts should all be within the protection scope of the present application.

The terms 'first', 'second', and 'third' in this application are only for the purpose of description, and cannot be construed as indicating or implying relative importance or implicitly indicating the number of technical features referred to. Therefore, the features preceded by 'first', 'second', and 'third' may explicitly or implicitly include at least one of the features. In the description of the present application, 'a plurality of' means at least two, such as two, three, etc., unless otherwise specifically defined. All directional indicators (such as up, down, left, right, front, back . . . ) in embodiments of the present application are only used to explain a motion state, a relative positional relationship between components in a specific posture (as shown in the drawings). If the specific posture changes, then the directional indicators will change accordingly. In addition, the terms 'include', 'comprise' and any variations thereof are intended to cover non-exclusive inclusion. For example, a process, a method, a system, a product, or a device that includes a series of operations or units is not limited to the listed operations or units, but optionally includes unlisted operations or units, or optionally also includes other operations or units inherent to these processes, methods, products or devices.

Reference to 'embodiments' herein means that a specific feature, structure, or characteristic described in conjunction with the embodiments may be included in at least one embodiment of the present application. The appearance of this phrase in various locations in the specification does not necessarily refer to the same embodiment, nor is it an independent or alternative embodiment mutually exclusive with other embodiments. Those skilled in the art may explicitly and implicitly understand that, the embodiments described herein may be combined with other embodiments.

The present application will be described in detail below with reference to the drawings and embodiments.

As shown in FIG. 1, FIG. 1 is a schematic structural diagram of an array substrate according to a first embodiment of the present application. In the present embodiment, an array substrate 101 is provided. The array substrate 101 includes a plurality of pixel units 1, a plurality of data lines 3, and a plurality of scan lines 2. The plurality of pixel units 1 are distributed in a matrix and are arranged in a plurality of rows and a plurality of columns. One scan line 2 is provided between every two adjacent rows of pixel units 1. Each scan line 2 is electrically connected to pixel units 1 in a row that corresponds to and is adjacent to the scan line 2. One data line 3 is provided between every two adjacent columns of pixel units 1. Each data line 3 is electrically connected to pixel units 1 in a column that corresponds to and is adjacent to the data line 3. In this way, the pixel units 1 are driven by the scan line 2 and the data line 3.

Specifically, each pixel unit 1 includes a display region 10 and a device region 20. The device region 20 and the display region 10 are provided adjacent to each other. The display region 10 includes a pixel electrode 11 and a common electrode 12. The pixel electrode 11 at least partially overlaps with the common electrode 12 in a direction perpendicular to the array substrate 101 to form a first storage capacitor Cst1.

As shown in FIG. 1, the pixel electrode 11 includes a main electrode 111 and a branch electrode 112. The main electrode 111 is in the shape of a "cross", which divides the display region 10 into a plurality of domains. A plurality of branch electrodes 112 are distributed in each domain and electrically connected to the main electrode 111. The branch electrodes 112 in each domain are arranged in different directions, such that the liquid crystals have a variety of rotational directions, thereby increasing a range of a viewing angle of the display panel 100 (see FIG. 9).

The common electrode 12 is provided below the pixel electrode 11 and is provided opposite to the pixel electrode 11, such that the pixel electrode 11 at least partially overlaps with the common electrode 12 in the direction perpendicular to the array substrate 101 so as to form the first storage capacitor Cst1, and to enable the pixel unit 1 to maintain a potential during a display process. Specifically, the common electrode 12 may be arranged in the same layer as the scan line 2 or in the same layer as the data line 3, depending on the actual demands. For example, the common electrode 12 may be arranged in the same layer as the data line 3, in order to reduce a vertical distance between the common electrode 12 and the pixel electrode 11. In this way, an electric capacitance of the first storage capacitor Cst1 is increased in order to improve a capability of the pixel unit 1 to maintain the potential and to reduce problems of reduced display brightness and screen flicker caused by leakage of electric current. The portion of the common electrode 12 that overlaps with the data line 3 can be arranged in another layer, and is connected to the other parts of the common electrode 12 through conductive vias, so as to avoid shorting the common electrode 12 to the data line 3. For example, the common electrode 12 and the data line 3 are located in a second metal layer. A part of the common electrode 12 that overlaps with the data line 3 is arranged in a first metal layer, and this part of the common electrode 12 is electrically connected to the remaining part of the common electrode 12 that are located in the first metal layer through conductive vias.

The common electrode 12 includes a first portion 121 and a second portion 122. The first portion 121 extends along an edge of a whole profile of the pixel electrode 11 to form a rectangular annulus. The annulus may be configured to shield a parasitic capacitance formed between the data line 3 and the pixel electrode 11, and to reduce a risk of interference or crosstalk. The second portion 122 is provided below the main electrode 111 of the pixel electrode 11, and is provided opposite to the main electrode 111. In other words, the second portion 122 overlaps with the main electrode 111 in the direction perpendicular to the array substrate 101 and extends along a lengthwise direction of the main electrode 111, such that two opposite ends of the second portion 122 are both electrically connected to the first portion 121. In this way, an area of a region where the common electrode 12 faces the pixel electrode 11 is increased, thereby increasing the electrical capacitance of the first storage capacitor Cst1, so as to improve the capability of the pixel unit 1 to maintain the potential and to avoid reduced display brightness and screen flicker phenomenon caused by leakage of electric current. Meanwhile, the common electrodes 12 from adjacent pixels are electrically connected to each other, so as to form an equal potential of the common electrodes 12, thereby facilitating supply of an identical voltage to the common electrodes 12 of various pixel units 1. In addition, by arranging the second portion 122 below the main electrode 111, a pixel aperture rate would not be reduced and influence on the brightness of the display panel is avoided.

Figure 2:
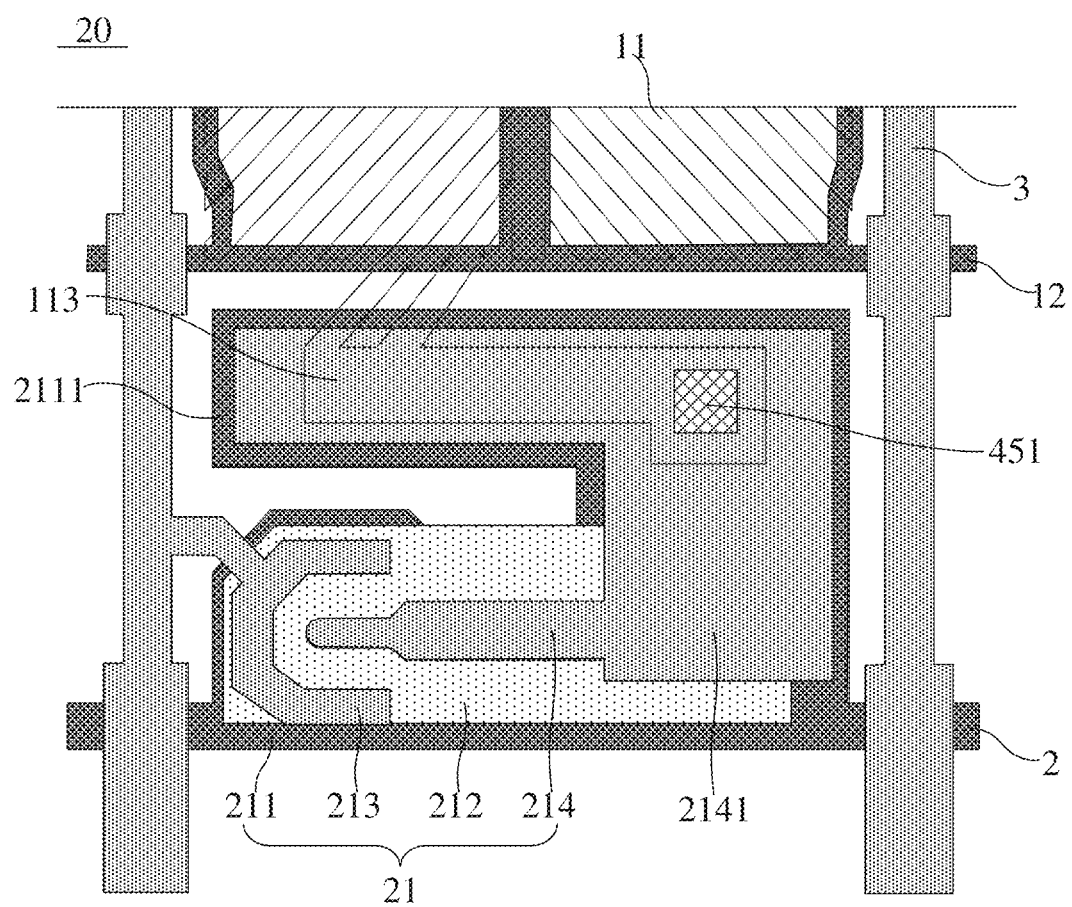
FIG. 2 is a schematic structural diagram of a device region of a pixel unit according to the embodiment of FIG. 1.

As shown in FIG. 2, FIG. 2 is a schematic structural diagram of the device region 20 of the pixel unit 1 according to the embodiment of FIG. 1. In the present embodiment, the device region 20 includes a drive transistor 21. The drive transistor 21 is electrically connected to the pixel electrode 11 so as to control the potential of the pixel electrode 11. The drive transistor 21 may be a thin film transistor TFT. The drive transistor 21 includes a gate 211, an active layer 212, a source 213 and a drain 214. The gate 211 is electrically connected to a corresponding scan line 2. The source 213 is electrically connected to a corresponding data line 3. The drain 214 is electrically connected to the pixel electrode 11.

The gate 211 extends in the direction towards the display region 10 to form a first extension portion 2111. The drain 214 extends in the direction towards the display region 10 to form a second extension portion 2141. The second extension portion 2141 is electrically connected to the pixel electrode 11. The first extension portion 2111 and the second extension portion 2141 overlap in the direction perpendicular to the array substrate 101 to form a second storage capacitor Cst2. Specifically, the shape and size of the first extension portion 2111 are generally identical to that of the second extension portion 2141, specific shape and area size may be set according to actual demands and specific limitations is not made here. For example, the shapes and area sizes of the first extension portion 2111 and the second extension portion 2141 may be set according to requirement of electrical capacitance and design space of the device region 20.

It should be noted that, for the array substrate 101 manufactured by the 4-Mask manufacturing procedure, in each pixel unit 1, since a gate-source capacitor Cgs between the gate 211 and the source 213 of the drive transistor 21 may change during the process of turning the gate 211 on and off, the capacitance of the gate-source capacitor Cgs is Cgs(on) when the gate 211 is on, and the capacitance of the gate-source capacitor Cgs is Cgs(off) when the gate 211 is off, and Cgs(on)>Cgs(off). Due to an introduction of this variable, the feed-in voltage difference of the pixels becomes greater, and an alternating current voltage component is more likely to appear and causes screen flicker phenomena.

Specifically, the feed-in voltage difference of the pixel is calculated by the following formulas:

$$\Delta Vp = \frac{Cgs}{Cgs + Clc + Cst}(Vgh - Vgl); \quad (1)$$

$$Clc(\max) = \frac{\varepsilon_0 \varepsilon_\perp A}{d}; \quad (2)$$

$$Clc(\min) = \frac{\varepsilon_0 \varepsilon_\parallel A}{d}; \quad (3)$$

$$\Omega = \Delta Vp(\max) - \Delta Vp(\min); \quad (4)$$

In the above formulas, $\Delta Vp$ is the feed-in voltage of the pixel; Cgs is the capacitor between the gate 211 and the source 213; Clc is the capacitor between the pixel electrode 11 and an electrode of a color film substrate 102, also referred to as a liquid crystal capacitor; Cst is a capacitor between the pixel electrode 11 and a potential reference electrode, also referred to as a storage capacitor; Vgh is a turn-on voltage of the drive transistor 21, Vgl is a turn-off voltage of the drive transistor; $\varepsilon_0$ is the vacuum dielectric constant or the vacuum permittivity; $\varepsilon_\perp$ is a dielectric constant when liquid crystals are horizontally aligned; $\varepsilon_\parallel$ is a dielectric constant when the liquid crystals are vertically aligned; A is an effective overlap area of a liquid crystal capacitor in pixels; d is a thickness of the liquid crystal layer 103; and $\Omega$ is the feed-in voltage difference.

In the present embodiment, the second storage capacitor Cst2 is formed by the first extension portion 2111 of the gate 211 and the second extension portion 2141 of the drain 214. That is, it may be appreciated that, one end of the second storage capacitor Cst2 is electrically connected to the gate 211 and the other end of the second storage capacitor Cst2 is electrically connected to the pixel electrode 11, such that the second storage capacitor Cst2 also varies during the process of turning the gate 211 on and off. When the gate 211 turns on, the capacitance of the second storage capacitor Cst2 is Cst2(on), when the gate 211 turns off, the capacitance of the second storage capacitor Cst2 is Cst2(off), and Cst2(on)>Cst2(off). A storage capacitor Cst of the pixel unit 1 is a sum of the first storage capacitor Cst1 and the second storage capacitor Cst2. That is, Cst=Cst1+Cst2. Therefore, due to the fact that the second storage capacitor Cst2 is a variable, then the storage capacitor Cst of the pixel unit 1 becomes a variable as well, and Cst(on)>Cst(off). That is, in the present embodiment, by introducing a second variable capacitor (the second storage capacitor Cst2), the problem that the feed-in voltage difference of the pixel becomes greater is thus compensated, thereby alleviating the screen flicker phenomenon that occurs in the display panel 100.

Specifically, as can be seen from formula (1), after the drive transistor 21 is turned on, the feed-in voltage of the pixel unit 1 is ΔVp(max), whose value is determined by the Cgs(on), Cst(on) and Clc(max). Compared with the feed-in voltage in the related art where the storage capacitor is a fixed value, the feed-in voltage in the present embodiment is less. That is, ΔVp(max) is less. After the drive transistor 21 is turned off, the feed-in voltage of pixel unit 1 is ΔVp(min), whose value is determined by the Cgs(off), Cst(off) and Clc(min). Compared with the feed-in voltage in the related art where the storage capacitor is a fixed value, the feed-in voltage in the present embodiment is greater. That is, by introducing the second storage capacitor Cst2, the ΔVp (max) becomes less and the ΔVp(min) becomes greater. By substituting the ΔVp(max) and the ΔVp(min) into the above formula (4), it should be known that, the feed-in voltage difference Ω of the pixel unit 1 will become less. It can be seen that, in the present embodiment, by introducing, on the basis of the original variable gate source capacitor Cgs, another variable, i.e., the second storage capacitor Cst2, the difference value by which the feed-in voltage difference of the pixel unit 1 becomes greater due to the variable gate-source capacitor Cgs may be neutralized or compensated, thereby effectively alleviating the screen flicker phenomenon occurring in the display panel 100. At the same time, in the present embodiment, only by extending the gate 211 of the drive transistor 21 to form the first extension portion 2111 and by extending the drain 214 to form the second extension portion 2141, the structure of the second storage capacitor Cst2 is formed. Not only the structure is simple, but it also allows that, during a preparation process of the array substrate 101, only the shapes of the gate 211 and the drain 214 need to be modified, no additional manufacturing procedures and processes are necessary, production cost and production time consumption are effectively saved, and production efficiency is improved.

Further, as shown in FIG. 2, in the present embodiment, a portion of the pixel electrode 11 extends to the device region 20 to form the third extension portion 113. The third extension portion 113 is electrically connected to the second extension portion 2141 through a conductive via 451. The third extension portion 113 overlaps with the first extension portion 2111 in the direction perpendicular to the array substrate 101 to form the third storage capacitor Cst3. That is, the pixel electrode 11 includes the third extension portion 113, which is located above the first extension portion 2111 of the device region 20 and is provided opposite to the first extension portion 2111. The third extension portion 113 is electrically connected to the second extension portion 2141, such that the third extension portion 113 is equipotential to the second extension portion 2141. The third extension portion 113 forms the third storage capacitor Cst3 with the first extension portion 2111. The third storage capacitor Cst3 is connected in series with the second storage capacitor Cst2, which may increase the electrical capacitance of the storage capacitor Cst and thus reduce the feed-in voltage difference of the pixel unit 1. Similar to the second storage capacitor Cst2, the third storage capacitor Cst3 is also a variable, whose electrical capacitance varies when the drive transistor 21 is turned on and off. In this way, the difference value by which the feed-in voltage difference of the pixel unit 1 becomes greater due to the variable gate-source capacitor Cgs may be further neutralized or compensated, thereby effectively alleviating the screen flicker phenomenon occurring in the display panel 100. Specifically, the shape and size of the third extension portion 113 may be set in accordance with actual demands, and no specific limitation is imposed in this regard.

Figure 3:
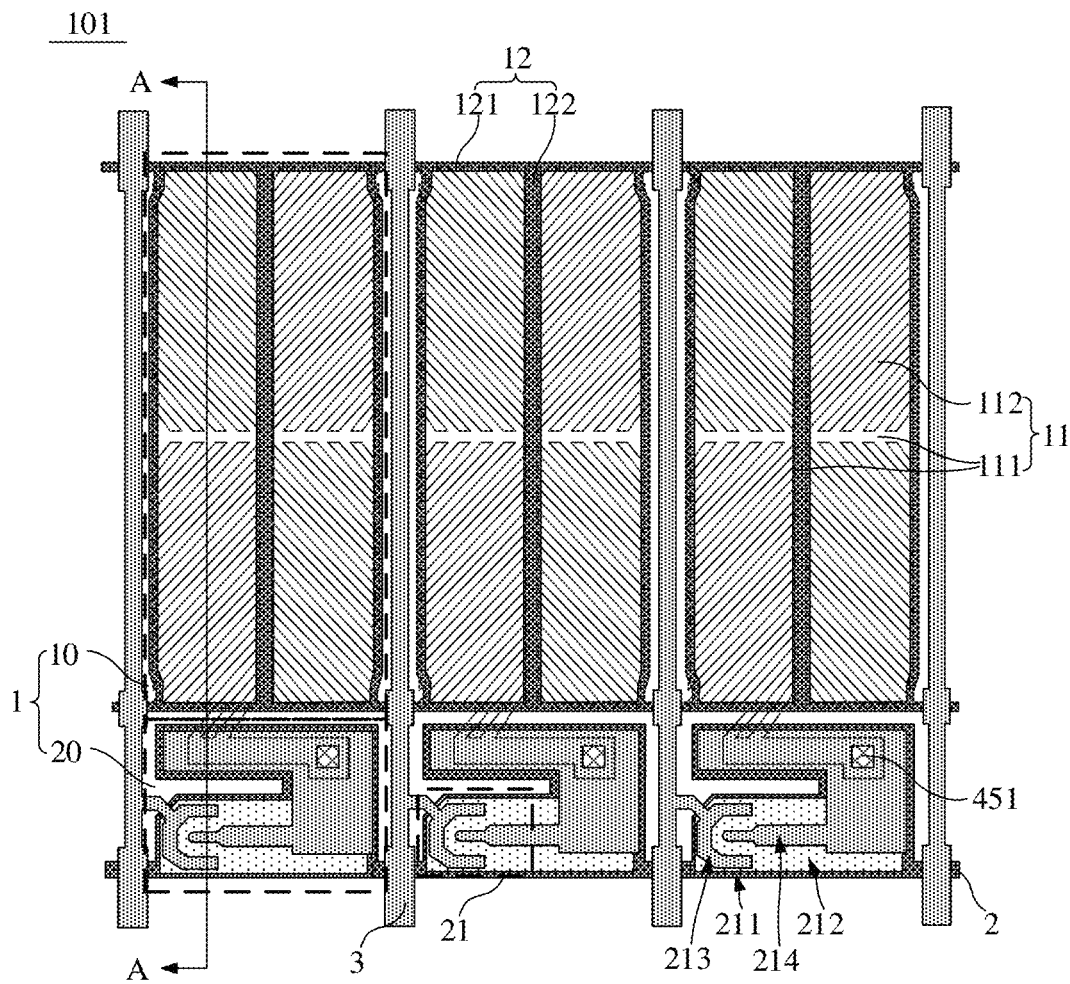
FIG. 3 is a schematic structural diagram of an array substrate according to a second embodiment of the present application.
Figure 4:
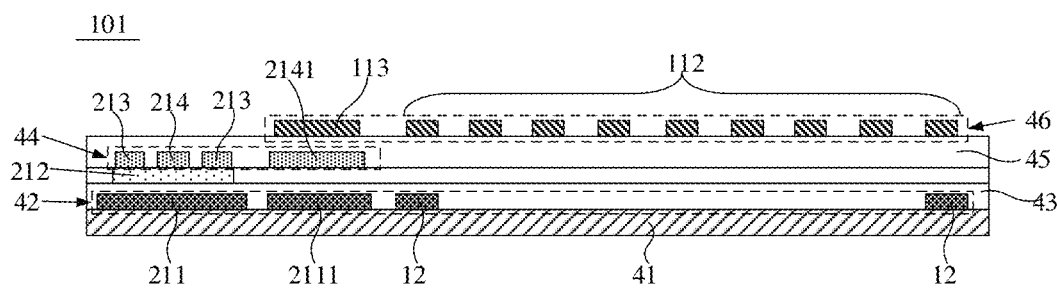
FIG. 4 is a schematic sectional structural diagram along a direction A-A of FIG. 3.
Figure 5:
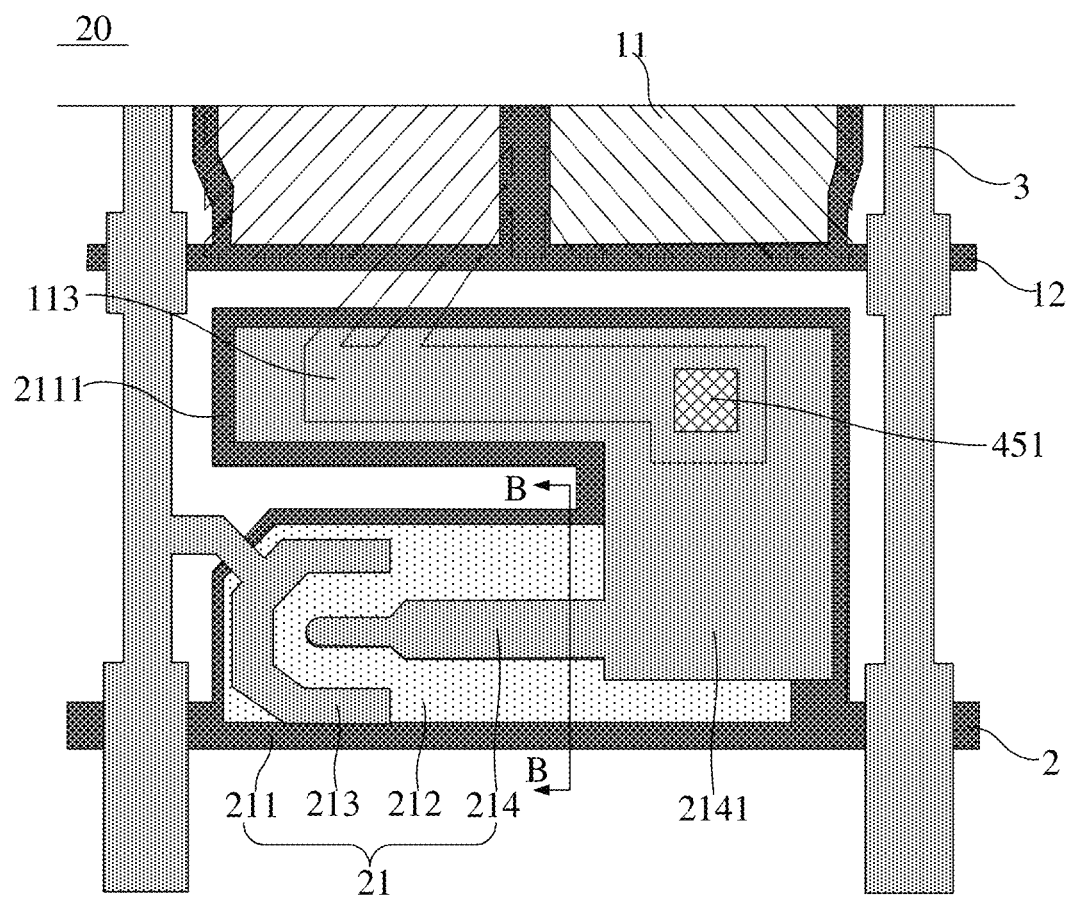
FIG. 5 is a schematic structural diagram of a device region of a pixel unit according to the embodiment of FIG. 3.
Figure 6:
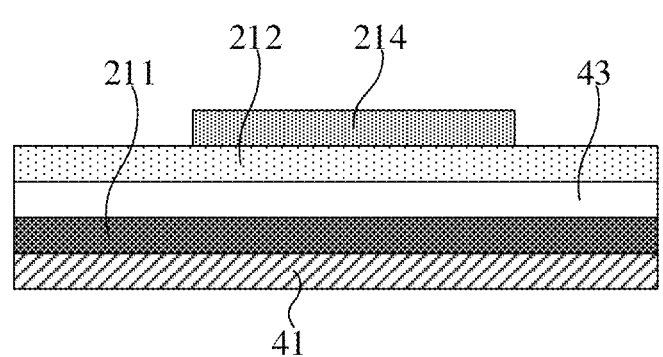
FIG. 6 is a schematic sectional structural diagram along a direction B-B of FIG. 5.

As shown in FIGS. 3-6, FIG. 3 is a schematic structural diagram of the array substrate 101 according to a second embodiment of the present application. FIG. 4 is a schematic structural diagram of the device region 20 of the pixel unit 1 according to the embodiment of FIG. 3. FIG. 5 is a schematic sectional structural diagram along a direction A-A of FIG. 3. FIG. 6 is a schematic sectional structural diagram along a direction B-B of FIG. 3. In the present embodiment, a second kind of array substrate 101 is provided. Unlike that in the above embodiment, for the array substrate 101 provided in the present embodiment, the gate 211 of the drive transistor 21 completely covers or overlays the active layer 212 in the direction perpendicular to the array substrate 101, thereby enabling the gate 211 to completely block or shield backlight in the region of the active layer 212, preventing the active layer 212 from being irradiated by light and avoiding leakage electrical current caused by carriers (electrons or holes) generated as a result of light irradiation in amorphous silicon material in the active layer 212. The leakage electrical current causes alternating current voltage components, which lead to a picture flickering problem.

Specifically, as shown in FIGS. 3 and 4, the array substrate 101 includes an underlayer substrate 41, a first metal layer 42, a first insulating layer 43, an active layer 212, a second metal layer 44, a second insulating layer 45 and a transparent conductive layer 46 that are successively laminated. The scan line 2, the gate 211, and the common electrode 12 are disposed in the first metal layer 42. The data line 3, the source 213, the drain 214 and the storage electrode are disposed in the second metal layer 44. The pixel electrode 11 is disposed in the transparent conductive layer 46. The active layer 212 is disposed between the gate 211 and the source 213 and between the gate 211 and the drain 214, to form the drive transistor 21 with the gate 211, the source 213 and the drain 214, for controlling a time when to charge the pixel electrode 11. Further, a projection of the gate 211 onto the second metal layer 44 completely covers that of the active layer 212 onto the second metal layer 44. That is, the gate 211 can completely block light in the direction perpendicular to the array substrate 101, thereby avoiding light from irradiating to the active layer 212. In this way, a stability of the drive transistor 21 may be maintained, thereby preventing a partial exposure of the active layer 212 due to absence of a light shielding layer beneath the drain 214. The partial exposure of the active layer 212 increases a risk of generating a leakage electrical current by the drive transistor 21 due to light irradiation on the exposed portion of the active layer 212. It should be easily appreciated that, after assembling the array substrate 101 to form the display apparatus, when the display panel 100 is operating, a backlight module 200 (see FIG. 10) is in a luminescence state, and a light path direction of the light source provided by the backlight module 200 is perpendicular to the array substrate 101. The light path direction is a direction from the underlayer substrate 41 to the transparent conductive layer 46. Therefore, by ensuring that the projection of the gate 211 onto the second metal layer 44 completely covers that of the active layer 212 onto the second metal layer 44, the backlight may be completely shielded from irradiating onto the region of the active layer 212, preventing the active layer 212 from being irradiated by light, and avoiding generation of leakage electrical current by the active layer 212. The leakage electrical current causes alternating current voltage components, which lead to a picture flickering problem. That is, the stability of the drive transistor 21 is effectively increased, thus effectively reducing the screen flicker problem caused by light-induced electrical leakage.

Specifically, the array substrate 101 involved in the above-mentioned embodiments may be prepared by a preparation method described below, the particular operations of which are specified below.

Figure 7:
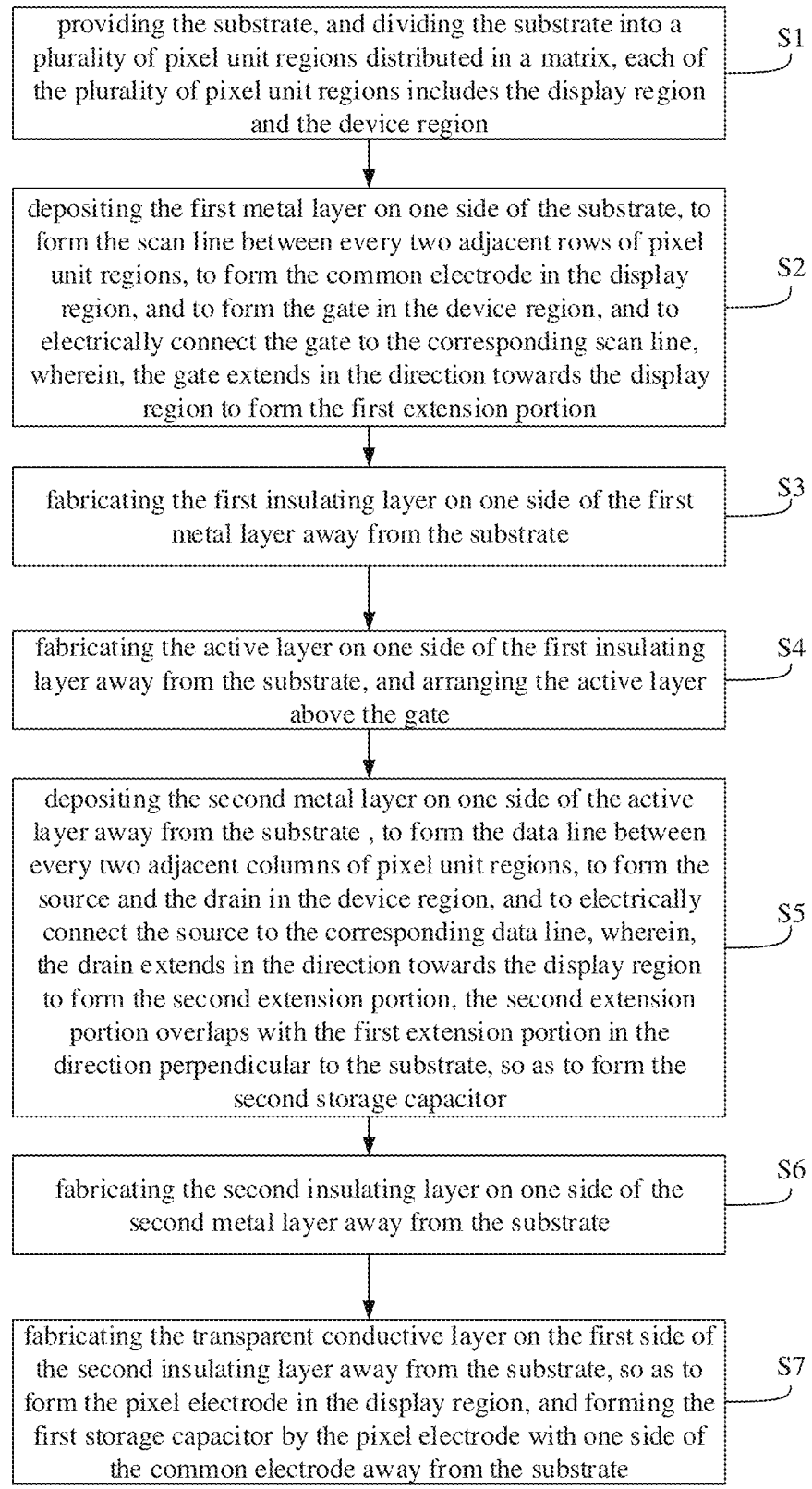
FIG. 7 is a schematic flowchart of a preparation method of an array substrate according to an embodiment of the present application.
Figure 8:
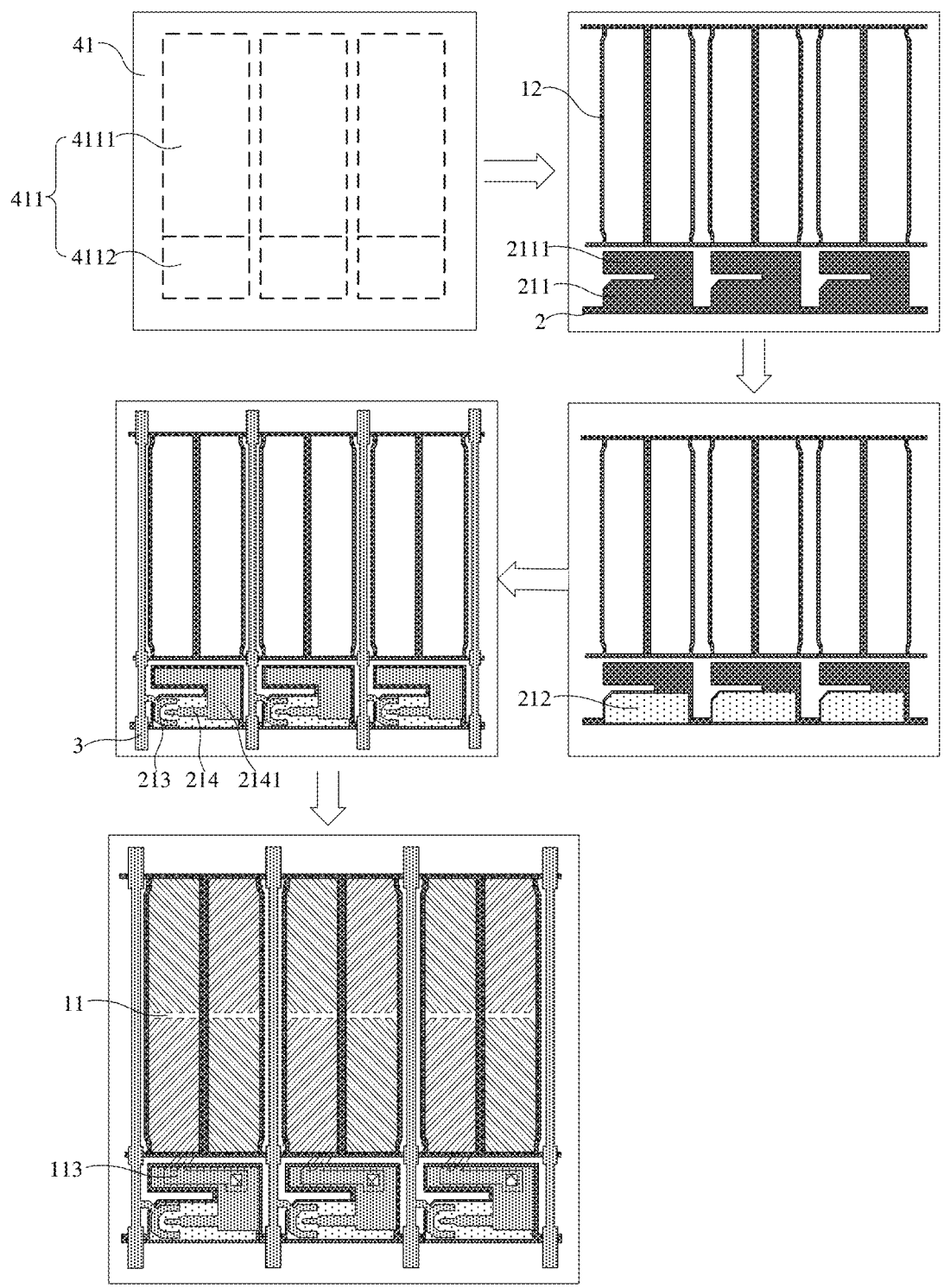
FIG. 8 is a schematic process flowchart of the preparation method according to the embodiment of FIG. 7.

As shown in FIGS. 7 and 8, FIG. 7 is a schematic flowchart of the preparation method of the array substrate 101 according to an embodiment of the present application, and FIG. 8 is a schematic process flowchart of the preparation method according to the embodiment of FIG. 7. In the present embodiment, the preparation method of the array substrate 101 includes operations at blocks shown in FIG. 7.

In an operation at block S1: providing the underlayer substrate 41, and dividing the underlayer substrate 41 into a plurality of pixel unit regions 411 distributed in a matrix. Each of the plurality of pixel unit regions 411 includes a display region 4111 and a device region 4112.

In an operation at block S2: depositing the first metal layer 42 on one side of the underlayer substrate 41, to form the scan line 2 between every two adjacent rows of pixel unit regions 411, to form the common electrode 12 in the display region 4111, and to form the gate 211 in the device region 4112, and to electrically connect the gate 211 to the corresponding scan line 2. The gate 211 extends in the direction toward the display region 4111 to form the first extension portion 2111.

In an operation at block S3: fabricating the first insulating layer 43 on one side of the first metal layer 42 away from the underlayer substrate 41.

In an operation at block S4: fabricating the active layer 212 on one side of the first insulating layer 43 away from the underlayer substrate 41, and arranging the active layer 212 above the gate 211.

In an operation at block S5: depositing the second metal layer 44 on one side of the active layer 212 away from the underlayer substrate 41, to form the data line 3 between every two adjacent columns of pixel unit regions 411, to form the source 213 and the drain 214 in the device region 4112, and to electrically connect the source 213 to the corresponding data line 3. The drain 214 extends in the direction towards the display region 4111 to form the second extension portion 2141. The second extension portion 2141 overlaps with the first extension portion 2111 in the direction perpendicular to the underlayer substrate 41, so as to form the second storage capacitor Cst2.

In an operation at block S6: fabricating the second insulating layer 45 on one side of the second metal layer 44 away from the underlayer substrate 41.

In an operation at block S7: fabricating the transparent conductive layer 46 on a first side of the second insulating layer 45 away from the underlayer substrate 41, so as to form the pixel electrode 11 in the display region 4111, and forming the first storage capacitor Cst1 by the pixel electrode 11 with one side of the common electrode 12 away from the underlayer substrate 41.

As shown in FIG. 8, the underlayer substrate 41 provided in the operation at block S1 may be a transparent underlayer substrate 41, and material of the underlayer substrate 41 may be glass, quartz, acrylic, resin, etc. In the present operation, the underlayer substrate 41 is divided, corresponding to the pixel unit 1 of the array substrate 101, into a plurality of pixel unit regions 411 distributed in a matrix. Each pixel unit region 411 is divided into the display region 4111 and the device region 4112, so as to provide a precise location for subsequent preparation of each component and wire routing.

The operation at block S2 may specifically include the following operations S21 and S22.

In the operation S21: depositing the first metal layer 42 on one side of the underlayer substrate 41.

In the operation S22: patterning the first metal layer 42, so as to form the scan line 2 between every two adjacent rows of pixel unit regions 411, to form the common electrode 12 in the display region 4111, to form the gate 211 in the device region 4112, and to electrically connect the gate 211 to the corresponding scan line 2. The electrical connection may be in a form of a metal wire route connection.

Specifically, the patterning of the first metal layer 42 may be performed by means of photomask etching. That is, the patterning is performed by a technical process which performs exposure and development using a mask plate, such that the first metal layer 42 is patterned to form the desired scan line 2, the gate 211 and the common electrode 12. The gate 211 is the gate 211 of the drive transistor 21, the gate 211 is electrically connected to the scan line 2, and the common electrode 12 is located in the display region 4111. Specifically, specific structures and functions of the scan line 2, the gate 211, and the common electrode 12 are the same as or similar to the specific structures and functions of the scan line 2, the gate 211, and the common electrode 12 involved in the above embodiments, and the same technical effects can be achieved. More details may be referred to the above description and will not be repeated here.

In some other embodiments, during the operation of patterning the first metal layer 42, the common electrode 12 may not be formed in the same operation. That is, only the scan line 2 and the gate 211 may be formed in the operation S22, and the common electrode 12 may be formed in the operation S52 described below, such that the common electrode 12 is arranged in the same layer as the data line 3.

Similar to the operation at block S2, the operation at block S5 may particularly include the following operations S51 and S52.

In the operation S51: depositing the second metal layer 44 on one side of the active layer 212 away from the underlayer substrate 41.

In the operation S52: patterning the second metal layer 44, so as to form the data lines 3 between every two adjacent columns of the pixel unit regions 411, to form the source 213 and the drain 214 in the device region 4112, and to electrically connect the source 213 to the corresponding data line 3.

In this operation, the patterning of the second metal layer 44 may also be performed by means of photomask etching. That is, the patterning is performed by the technical process which performs exposure and development using a mask plate, such that the data line 3, the source 213 and the drain 214 of the drive transistor 21 are formed in the second metal layer 44. The source 213 is electrically connected to a corresponding data line 3. The electrical connection may be in the form of the metal wire route connection.

In the above operation, by overlapping the first extension portion 2111 of the gate 211 with the second extension portion 2141 of the drain 214 in the direction perpendicular to the underlayer substrate 41 to form the second storage capacitor Cst2, the electrical capacitance of the second storage capacitor Cst2 when the drive transistor 21 is turned on is greater than that of the second storage capacitor Cst2 when the drive transistor 21 is turned off, a variable second storage capacitor Cst2 is introduced. In this way, the difference value by which the feed-in voltage difference of the pixel unit 1 becomes greater due to the variable gate-source capacitor Cgs is neutralized or compensated by the second storage capacitor Cst2, thereby effectively alleviating the screen flicker phenomenon occurring in the display panel 100. At the same time, in the present preparation method, only by extending the gate 211 of the drive transistor 21 to form the first extension portion 2111 and by extending the drain 214 to form the second extension portion 2141, the structure of the second storage capacitor Cst2 is formed. Not only the structure is simple, but it also allows that, during the preparation process of the array substrate 101, only the shapes of the gate 211 and the drain 214 need to be modified, no additional manufacturing procedures and processes are necessary, the production cost and the production time consumption are effectively saved, and the production efficiency is improved.

Further, in the operations at blocks S2 and S4, by setting the shape and size of the gate 211 and the location of the active layer 212 and the gate 211, the projection of the gate 211 onto the underlayer substrate 41 completely covers the projection of the active layer 212 onto the underlayer substrate 41, such that the backlight may be completely shielded by the gate 211 from irradiating onto the region of the active layer 212, thereby preventing the active layer 212 from being irradiated by light, and avoiding generation of leakage electrical current by the active layer 212. The leakage electrical current causes alternating current voltage components, which lead to the picture flickering problem.

Specifically, after the operation at block S6, the method further includes: defining a conductive via 451 in the second insulating layer 45 that is located in an area of the second extension portion 2141, and electrically connecting the conductive via 451 to the second extension portion 2141.

After fabricating the second insulating layer 45, it is necessary to define the conductive via 451 in the second insulating layer 45, which penetrates the second insulating layer 45 and reaches the second extension portion 2141, so as to be electrically connected to the second extension portion 2141.

In the operation at block S7, during the process of fabricating the pixel electrodes 11, the method further includes: extending the pixel electrode 11 in the direction towards the device region 20 to form a third extension portion 113, covering the conductive via 451 with the third extension portion 113 and electrically connecting the third extension portion 113 with the second extension portion 2141; and arranging the third extension portion 113 above the first extension portion 2111, such that the third extension portion 113 and the first extension portion 2111 overlap in the direction perpendicular to the underlayer substrate 41 to form the third storage capacitor Cst3.

In the present operation, by ensuring that, the pixel electrode 11 includes the third extension portion 113, which is located above the first extension portion 2111 of the device region 20 and is provided opposite to the first extension portion 2111, the third extension portion 113 is electrically connected to the second extension portion 2141, such that the third extension portion 113 is equipotential to the second extension portion 2141. The third extension portion 113 forms the third storage capacitor Cst3 with the first extension portion 2111. The third storage capacitor Cst3 is connected in series with the second storage capacitor Cst2, which may increase the electrical capacitance of the storage capacitor Cst and thus reduce the feed-in voltage difference of the pixel unit 1. Similar to the second storage capacitor Cst2, the third storage capacitor Cst3 is also a variable. The electrical capacitance value of the third storage capacitor Cst3 varies when the drive transistor 21 is turned on and off. In this way, the difference value by which the feed-in voltage difference of the pixel unit 1 becomes greater due to the variable gate-source capacitor Cgs may be further neutralized or compensated, thereby effectively alleviating the screen flicker phenomenon occurring in the display panel 100. Specifically, the shape and size of the third extension portion 113 may be set in accordance with actual demands, and no specific limitation is imposed in this regard.

Figure 9:
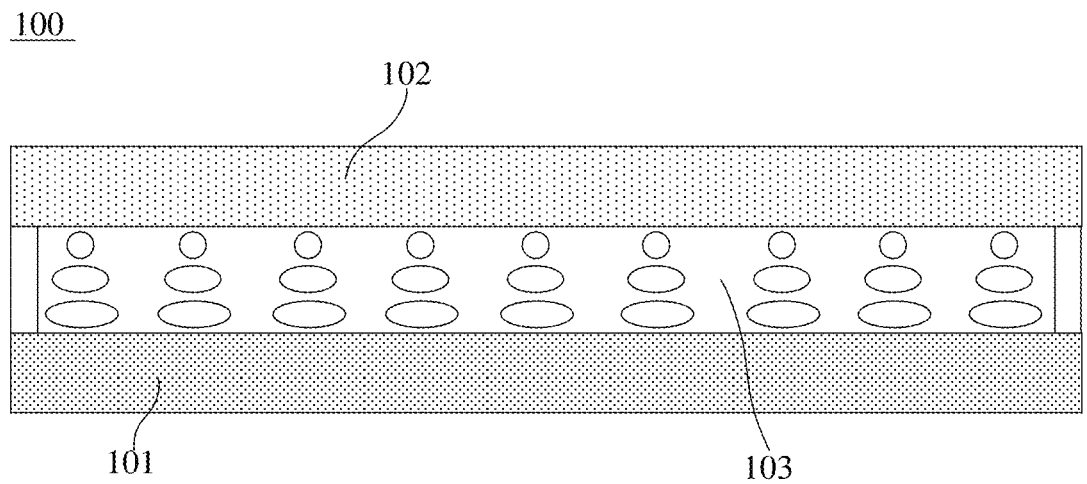
FIG. 9 is a schematic structural diagram of a display panel according to an embodiment of the present application.

As shown in FIG. 9, FIG. 9 is a schematic structural diagram of the display panel 100 according to an embodiment of the present application. In the present embodiment, the display panel 100 is provided. The display panel 100 includes the array substrate 101, the color film substrate 102 and the liquid crystal layer 103. The array substrate 101 and the color film substrate 102 are arranged opposite to each other, and the liquid crystal layer 103 is arranged between the array substrate 101 and the color film substrate 102.

Specifically, the specific structure and function of the array substrate 101 is the same or similar to the specific structure and function involved in the above-mentioned embodiments, and can achieve the same technical effect. For more details, the specific illustration above may be referred to, and will not be repeated here. The array substrate 101 may be specifically produced by the preparation method in the above-mentioned embodiments, and the specific steps and procedures can be found in the specific description of the above embodiments.

The color film substrate 102 is configured to form an electric field between the color film substrate 102 and the array substrate 101, so as to control rotation angles of liquid crystal molecules in the liquid crystal layer 103, and thus to control the amount of light transmitted, in order to achieve bright and dark effects of the images. At the same time, the color film substrate 102 also includes a color resistant layer (not shown) for light filtering, so as to achieve full color display of the image.

In other embodiments, the display panel 100 may also be an electrophoretic display panel 100. The display panel 100 may specifically include the array substrate 101, a counter underlayer substrate 41 and an electrophoretic layer. The array substrate 101 and the counter underlayer substrate 41 are arranged opposite to each other. The electrophoretic layer is arranged between the array substrate 101 and the counter underlayer substrate 41. The array substrate 101 has structures and functions same or similar to the structures and functions of the array substrate 101 involved in the above-mentioned embodiments, may achieve the same technical effects, and may be produced by the above-mentioned preparation method. Of course, the display panel 100 may also be other types of display panels 100, which are not specifically limited.

Figure 10:
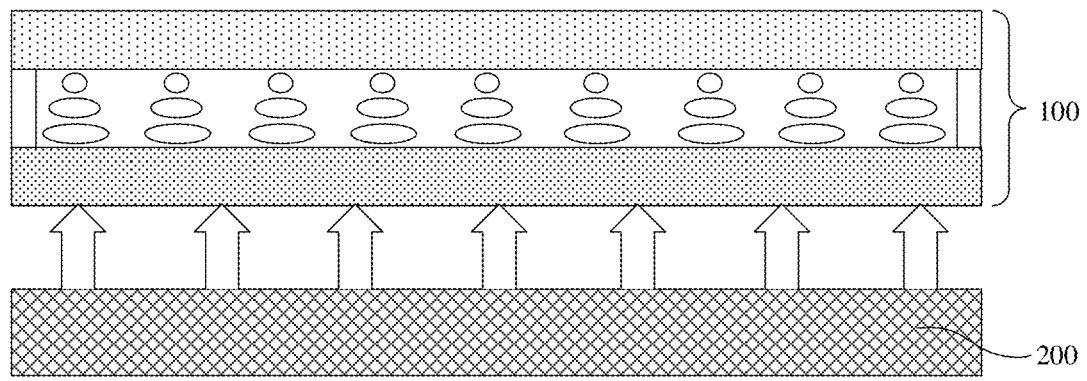
FIG. 10 is a schematic structural diagram of a display apparatus according to an embodiment of the present application.

As shown in FIG. 10, FIG. 10 is a schematic structural diagram of a display apparatus according to an embodiment of the present application. In the present embodiment, a display apparatus is provided. The display apparatus includes the display panel 100 and a backlight module 200. The display panel 100 is arranged opposite to the backlight module 200. The display panel 100 is configured to display an image, and the backlight module 200 is configured to provide backlight for the display panel 100.

Specifically, the display panel 100 includes the array substrate 101 involved in the above-mentioned embodiments. The array substrate 101 has specific structures and functions that are the same or similar to the structures and functions of the array substrate 101 involved in the above-mentioned embodiments, may achieve the same technical effect, and may be produced by the above-mentioned preparation method. The display panel 100 may specifically be a liquid crystal display panel 100 or an electrophoretic display panel 100 etc. that require backlight.

The backlight module 200 is configured to provide a backlight source to the display panel 100. The backlight module 200 may specifically be a direct-lit backlight module 200 or an edge-lit backlight module 200, which is not specifically limited and can be set according to actual needs.

For the display apparatus provided in the present embodiment, by introducing the variable second storage capacitor Cst2, the difference value by which the feed-in voltage difference of the pixel unit 1 becomes greater due to the variable gate-source capacitor Cgs may be neutralized or compensated, thereby effectively alleviating the screen flicker phenomenon occurring in the display panel 100. At the same time, in the present embodiment, only by extending the gate 211 of the drive transistor 21 in the array substrate 101 to form the first extension portion 2111 and by extending the drain 214 to form the second extension portion 2141, the structure of the second storage capacitor Cst2 is formed. Not only the structure is simple, but it also allows that, during the preparation process of the array substrate 101 in the display apparatus, only the shapes of the gate 211 and the drain 214 need to be modified, no additional manufacturing procedures and processes are necessary, the production cost and the production time consumption are effectively saved, and the production efficiency is improved.

The above are only implementations of the present application, and do not limit the patent scope of the present application. Any equivalent changes to the structures or processes made by the description and drawings of the present application or directly or indirectly used in other related technical fields are included in the protection scope of this application.

What is claimed is:

1. An array substrate comprising a plurality of pixel units distributed in a matrix and a plurality of scan lines and a plurality of data lines, the plurality of scan lines and the plurality of data lines being configured for driving the plurality of pixel units, each of the pixel units comprising:
    a display region, comprising a pixel electrode and a common electrode, the pixel electrode at least partially overlapping with the common electrode in a direction perpendicular to the array substrate to form a first storage capacitor; and
    a device region, being adjacent to the display region and comprising a drive transistor, the drive transistor being electrically connected to the pixel electrode, the drive transistor comprising a gate, an active layer, a source and a drain, the gate being electrically connected to a corresponding one of the plurality of scan lines, the source being electrically connected to a corresponding one of the plurality of data lines, the drain being electrically connected to the pixel electrode;
    the gate extends in a direction towards the display region to form a first extension portion; the drain extends in the direction towards the display region to form a second extension portion, the second extension portion is electrically connected to the pixel electrode; the first extension portion and the second extension portion overlap in the direction perpendicular to the array substrate to form a second storage capacitor;
    the pixel electrode partially extends to the device region to form a third extension portion, the third extension portion is electrically connected to the second extension portion through a conductive via; and
    the third extension portion overlaps with the first extension portion in the direction perpendicular to the array substrate, to form a third storage capacitor.

2. The array substrate as claimed in claim 1, wherein the array substrate comprises an underlayer substrate, the array substrate further comprises a first metal layer, a first insulating layer, an active layer, a second metal layer, a second insulating layer and a transparent conductive layer successively laminated on the underlayer;
    wherein, the scan line, the gate and the common electrode are located in the first metal layer, the data line, the source and the drain are located in the second metal layer, and the pixel electrode is located in the transparent conductive layer.

3. The array substrate as claimed in claim 1, wherein the array substrate comprises an underlayer substrate, the array substrate further comprises a first metal layer, a first insulating layer, an active layer, a second metal layer, a second insulating layer and a transparent conductive layer successively laminated on the underlayer;
    wherein, the scan line and the gate are located in the first metal layer, the data line, the source, the drain and the common electrode are located in the second metal layer, and the pixel electrode is located in the transparent conductive layer.

4. The array substrate as claimed in claim 2, wherein the active layer is provided between the gate and the source and between the gate and the drain, and a projection of the gate onto the second metal layer completely covers that of the active layer onto the second metal layer.

5. The array substrate as claimed in claim 1, wherein the pixel electrode comprises a main electrode and a branch electrode, the main electrode divides the display region into a plurality of domains, the branch electrode is electrically connected to the main electrode;
    the common electrode comprises a first portion and a second portion, the first portion extends along an edge of a whole profile of the pixel electrode to form an annulus, the second portion overlaps with the main electrode in the direction perpendicular to the array substrate, and the opposite two ends of the second portion are electrically connected to the first portion.

6. A preparation method of an array substrate, comprising:
    providing an underlayer substrate, and dividing the underlayer substrate into a plurality of pixel unit regions distributed in a matrix, wherein, each of the plurality of pixel unit regions comprises a display region and a device region;
    depositing a first metal layer on one side of the underlayer substrate, to form a scan line between every two adjacent rows of the pixel unit regions, to form a common electrode in the display region, to form a gate in the device region, and to electrically connect the gate to a corresponding scan line, wherein, the gate extends in a direction towards the display region to form a first extension portion;

fabricating a first insulating layer on one side of the first metal layer away from the underlayer substrate;

fabricating an active layer on one side of the first insulating layer away from the underlayer substrate, and arranging the active layer above the gate;

depositing a second metal layer on one side of the active layer away from the underlayer substrate, to form a data line between every two adjacent columns of the pixel unit regions, to form a source and a drain in the device region, and to electrically connect the source to a corresponding data line; wherein, the drain extends in the direction towards the display region to form a second extension portion, the second extension portion overlaps with the first extension portion in a direction perpendicular to the underlayer substrate and forms a second storage capacitor;

fabricating a second insulating layer on one side of the second metal layer away from the underlayer substrate; and fabricating a transparent conductive layer on a first side of the second insulating layer away from the underlayer substrate, to form a pixel electrode in the display region, and to form a first storage capacitor by the pixel electrode with one side of the common electrode away from the underlayer substrate;

after the fabricating the second insulating layer on one side of the second metal layer away from the underlayer substrate, the method further comprises:
  defining a conductive via in the second insulating layer located in an area of the second extension portion, and electrically connecting the conductive via to the second extension portion;

the fabricating the transparent conductive layer on the first side of the second insulating layer away from the underlayer substrate further comprises:
  extending the pixel electrode in a direction towards the device region to form a third extension portion, covering the conductive via with the third extension portion and electrically connecting the third extension portion with the second extension portion; and arranging the third extension portion above the first extension portion, such that the third extension portion and the first extension portion overlap in the direction perpendicular to the underlayer substrate to form a third storage capacitor.

7. The preparation method as claimed in claim 6, wherein a projection of the gate onto the underlayer substrate completely covers a projection of the active layer onto the underlayer substrate.

8. The preparation method as claimed in claim 6, wherein the depositing the first metal layer on one side of the underlayer substrate, to form the scan line between every two adjacent rows of the pixel unit regions, to form the common electrode in the display region, to form the gate in the device region, and to electrically connect the gate to the corresponding scan line further comprises:
  depositing the first metal layer on one side of the underlayer substrate; and
  patterning the first metal layer to form the scan line between every two adjacent rows of pixel unit regions, to form the common electrode in the display region, to form the gate in the device region, and to electrically connect the gate to the corresponding scan line;

the depositing the second metal layer on one side of the active layer away from the underlayer substrate, to form the data line between every two adjacent columns of the pixel unit regions, to form the source and the drain in the device region, and to electrically connect the source to the corresponding data line comprises:
  depositing the second metal layer on the side of the active layer away from the underlayer substrate; and
  patterning the second metal layer, to form the data line between every two adjacent columns of the pixel unit regions, to form the source and the drain in the device region, and to electrically connect the source to the corresponding data line.

9. A display apparatus, comprising:
a display panel, configured for displaying an image; and
a backlight module, arranged opposite to the display panel, and configured for providing backlight for the display panel,
wherein, the display panel comprises an array substrate, the array substrate comprises a plurality of pixel units distributed in a matrix and a plurality of scan lines and a plurality of data lines, the plurality of scan lines and the plurality of data lines are configured for driving the plurality of pixel units, each of the pixel units comprises:
  a display region, comprising a pixel electrode and a common electrode, the pixel electrode at least partially overlapping with the common electrode in a direction perpendicular to the array substrate to form a first storage capacitor; and
  a device region, being adjacent to the display region and comprising a drive transistor, the drive transistor being electrically connected to the pixel electrode, the drive transistor comprising a gate, an active layer, a source and a drain, the gate being electrically connected to a corresponding one of the plurality of scan lines, the source being electrically connected to a corresponding one of the plurality of data lines, the drain being electrically connected to the pixel electrode;
wherein, the gate extends in a direction towards the display region to form a first extension portion; the drain extends in the direction towards the display region to form a second extension portion, the second extension portion is electrically connected to the pixel electrode; the first extension portion and the second extension portion overlap in the direction perpendicular to the array substrate to form a second storage capacitor;
the pixel electrode partially extends to the device region to form a third extension portion, the third extension portion is electrically connected to the second extension portion through a conductive via; and
the third extension portion overlaps with the first extension portion in the direction perpendicular to the array substrate, to form a third storage capacitor.

10. The display apparatus as claimed in claim 9, wherein the array substrate comprises an underlayer substrate, the array substrate further comprises a first metal layer, a first insulating layer, an active layer, a second metal layer, a second insulating layer and a transparent conductive layer successively laminated on the underlayer;
wherein, the scan line, the gate and the common electrode are located in the first metal layer, the data line, the source and the drain are located in the second metal layer, and the pixel electrode is located in the transparent conductive layer.

11. The display apparatus as claimed in claim 9, wherein the array substrate comprises an underlayer substrate, the array substrate further comprises a first metal layer, a first insulating layer, an active layer, a second metal layer, a second insulating layer and a transparent conductive layer successively laminated on the underlayer; wherein, the scan line and the gate are located in the first metal layer, the data line, the source, the drain and the common electrode are located in the second metal layer, and the pixel electrode is located in the transparent conductive layer.

12. The display apparatus as claimed in claim 10, wherein the active layer is provided between the gate and the source and between the gate and the drain, and a projection of the gate onto the second metal layer completely covers that of the active layer onto the second metal layer.

13. The display apparatus as claimed in claim 9, wherein the pixel electrode comprises a main electrode and a branch electrode, the main electrode divides the display region into a plurality of domains, the branch electrode is electrically connected to the main electrode;
the common electrode comprises a first portion and a second portion, the first portion extends along an edge of a whole profile of the pixel electrode to form an annulus, the second portion overlaps with the main electrode in the direction perpendicular to the array substrate, and the opposite two ends of the second portion are electrically connected to the first portion.

14. The display apparatus as claimed in claim 9, wherein the display panel further comprises a color film substrate and a liquid crystal layer, the color film substrate and the array substrate are arranged opposite to each other, the liquid crystal layer is arranged between the array substrate and the color film substrate.

15. The display apparatus as claimed in claim 9, wherein the display panel further comprises a counter underlayer substrate and an electrophoretic layer, the array substrate and the counter underlayer substrate are arranged opposite to each other, the electrophoretic layer is arranged between the array substrate and the counter underlayer substrate.

16. The display apparatus as claimed in claim 9, wherein the backlight module is a direct-lit backlight module or an edge-lit backlight module.

17. The display apparatus as claimed in claim 11, wherein a part of the common electrode that overlaps with the data line is located in the first metal layer, and is connected to a remaining part of the common electrode in the second metal layer through conductive vias.

* * * * *